United States Patent
Kato et al.

(10) Patent No.: US 8,249,850 B2
(45) Date of Patent: *Aug. 21, 2012

(54) METHOD AND AN APPARATUS FOR EXECUTING SIMULATION FOR SYSTEM PERFORMANCE EVALUATION

(75) Inventors: Tomoki Kato, Kawasaki (JP); Noriyasu Nakayama, Kawasaki (JP); Hiroyuki Hieda, Hyogo (JP)

(73) Assignee: Fujitsu Limited, Kawasaki (JP)

( * ) Notice: Subject to any disclaimer, the term of this patent is extended or adjusted under 35 U.S.C. 154(b) by 732 days.

This patent is subject to a terminal disclaimer.

(21) Appl. No.: 12/393,155

(22) Filed: Feb. 26, 2009

(65) Prior Publication Data
US 2009/0313001 A1 Dec. 17, 2009

(30) Foreign Application Priority Data

Jun. 11, 2008 (JP) .................................. 2008-153505

(51) Int. Cl.
G06F 17/50 (2006.01)
(52) U.S. Cl. ............................................ 703/14; 703/13
(58) Field of Classification Search .................. 703/13, 703/14
See application file for complete search history.

(56) References Cited

U.S. PATENT DOCUMENTS

| 7,366,647 B2 * | 4/2008 | Araya et al. ................... 703/14 |
| 2002/0022942 A1 | 2/2002 | Nakamura |
| 2002/0066082 A1 * | 5/2002 | Araya et al. .................. 717/135 |
| 2002/0129329 A1 | 9/2002 | Nishioka et al. |
| 2003/0121010 A1 * | 6/2003 | Aubury ............................ 716/4 |
| 2005/0261884 A1 * | 11/2005 | Sakamoto et al. .............. 703/13 |
| 2007/0271080 A1 | 11/2007 | Tatsuoka et al. |
| 2008/0306721 A1 * | 12/2008 | Yang ............................... 703/14 |
| 2009/0150136 A1 * | 6/2009 | Yang ............................... 703/13 |
| 2009/0204380 A1 * | 8/2009 | Kato et al. ...................... 703/13 |
| 2010/0204975 A1 * | 8/2010 | Nakayama et al. ............. 703/20 |
| 2011/0184713 A1 * | 7/2011 | Yang ............................... 703/13 |

FOREIGN PATENT DOCUMENTS

| JP | 2001-318812 | 11/2001 |
| JP | 2002-215423 | 8/2002 |
| JP | 2006-59108 | 3/2006 |
| JP | 2007-310449 | 11/2007 |
| KR | 10-0812938 | 3/2008 |

OTHER PUBLICATIONS

Korean Intellectual Property Office Action issued Dec. 30, 2010 for corresponding Korean Patent Application 10-2009-0024890.

* cited by examiner

*Primary Examiner* — Mary C Jacob
*Assistant Examiner* — Aniss Chad
(74) *Attorney, Agent, or Firm* — Staas & Halsey LLP

(57) ABSTRACT

The present invention relates to a technique for executing performance evaluation simulation of a system to be implemented by software or hardware. A simulation apparatus includes a first acquisition section for executing existing tentative software to acquire a first execution log, a division section for dividing the first execution log into a plurality of basic processing units, a basic processing execution log production section for modifying some of the plural basic processing units to produce a basic processing execution log to be used for simulation, and a simulation execution section for inputting the basic processing execution log to a hardware model to execute the simulation to acquire information required for the performance evaluation.

9 Claims, 14 Drawing Sheets

FIG. 2

```c
include <stdio.h> void ex_test0( int A );

void test1(int num) {
  ...
  if(num == example1){
    DT_READ(addr1,offset,data);
    ...
    if( *** ){
      DT_READ(addr2,offset,data);
      ...
      DT_READ(addr3,offset,data);
      ex_test0( num );
      ...
    }
    else{
      DT_READ(addr4,offset,data);
      ...
    }
  }
  ...
}
```

FIG. 3

| No. | time  | type   | Object(¥#line)        | Address    |
|-----|-------|--------|-----------------------|------------|
| 00  | 30539 | Instr  | test_A.¥#398..#405    | 0x000080B4 |
| 01  | 30542 | Instr  | test_A.¥#405          | 0x000080B8 |
| 02  | 30557 | Instr  | test_A.¥#406          | 0x000080A4 |
| 03  | 30572 | Instr  | test_B.¥#174          | 0x00008114 |
| 04  | 30575 | Instr  | test_B.¥#175..#196    | 0x00008118 |
| 05  | 30578 | Instr  | test_B.¥#196          | 0x0000811C |
| 06  | 30581 | Instr  | test_B.¥#196          | 0x00008120 |
| 07  | 30584 | Instr  | test_B.¥#196          | 0x00008124 |
| 08  | 30601 | R Data |                       |            |
| 09  | 30601 | Instr  | test_B.¥#196          | 0x00008128 |
| 10  | 30602 | Instr  | test_B.¥#196          | 0x0000812C |
| 11  | 30613 | W Data |                       |            |
| 12  | 30613 | Instr  | test_B.¥#196          | 0x00008130 |
| ... |       |        |                       |            |

EXECUTION LOG

FIG. 4

| time | Etc. | Test_A | Test_B |
|------|------|--------|--------|
| 30530 | #100 | | |
| 30539 | | #398 <br> . <br> . <br> #404 | |
| 30542 | | #405 | |
| 30557 | | #406 | |
| 30572 | | | #174 |
| 30575 | | | #175 <br> . <br> . <br> #195 |
| 30578 | | | #196 |
| 30581 | | | |
| 30584 | | | |
| 30601 | | | |
| 30602 | | | |
| 30613 | | | |
| ... | ... | ... | ... |

OBJECT SEQUENCE TABLE

FIG. 5
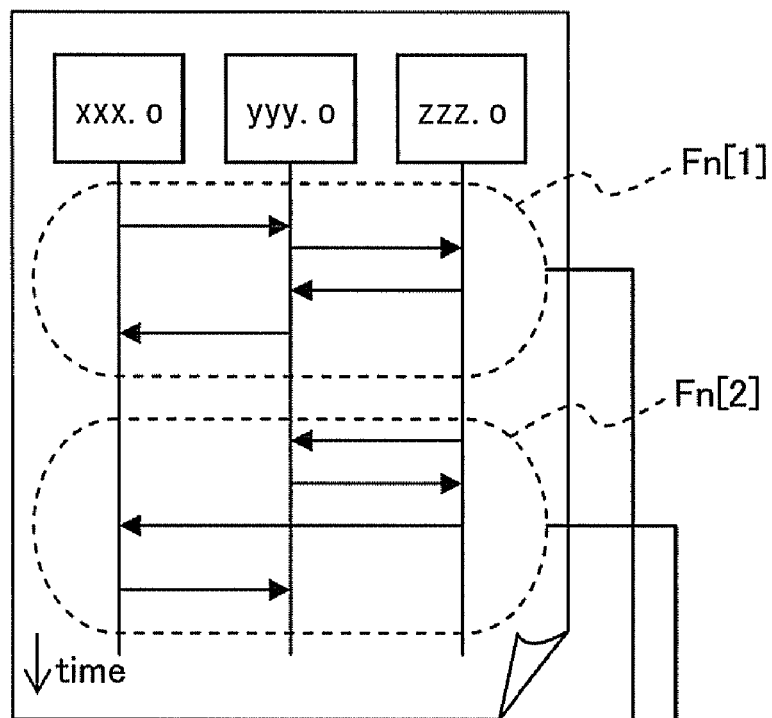
SIMPLIFIED SEQUENCE DIAGRAM IMAGE
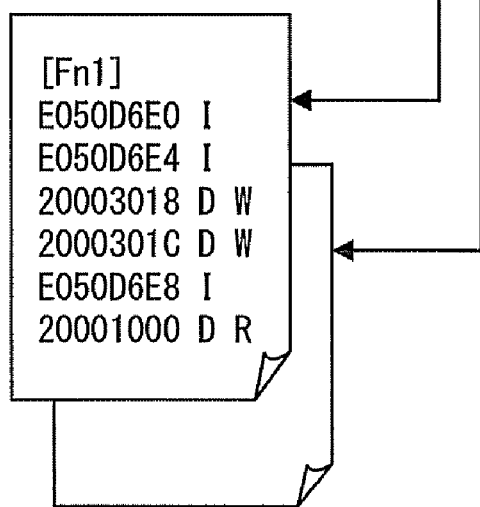
EXECUTION LOG OF
BASIC PROCESSING UNIT

METHOD AND AN APPARATUS FOR EXECUTING SIMULATION FOR SYSTEM PERFORMANCE EVALUATION

CROSS-REFERENCE TO RELATED APPLICATION(S)

This application is based upon and claims the benefit of the priority of the prior Japanese Application No. 2008-153505 filed on Jun. 11, 2008 in Japan, the entire contents of which are hereby incorporated by reference.

FIELD

The embodiments discussed herein are related to a technique for executing performance evaluation simulation of a system to be implemented by software and hardware.

BACKGROUND

In recent years, a semiconductor device to be used with an electronic equipment such as, for example, a Large Scale Integration (LSI) is integrated in a large scale, and a processor, a bus, a memory and so forth which are conventionally used individually as individual elements can be incorporated on one chip.

Generally, the object of the integration into one chip resides in downsizing, cost down and reduction in power consumption. Such a semiconductor device as described above is called system LSI or System on Chip (SoC).

However, increase of functions to be incorporated in such a semiconductor device (hereinafter referred to sometimes as LSI or system LSI) as described above gives rise to a demerit that it increases the difficulty of the design. Most part of the difficulty originates from the fact that, by integration into one chip, a hardware architecture determined once cannot be easily changed later.

Particularly, in order to press onward with downsizing and cost down, reduction of the processing load to the system LSI and reduction of the margin on the design are required, and a performance verification technique at a first stage of the design is important to solve the problem described above.

The performance verification of a system LSI or the like is carried out after provisional decision is carried out regarding whether a function which a system has is to be implemented by hardware or software.

Generally, the software is described in the C language, an assembly language or some other language, and operation of the software can be simulated by execution on an actual apparatus model including a target processor or an Instruction Set Simulator (ISS) for a target processor.

Further, regarding operation of the hardware, simulation can be carried out by description using the Register Transfer Level (RTL), the Transaction Level Model (TLM), or both of the RTL and the TLM. It is to be noted that a representative RTL is the Verilog-HDL and a representative TLM is the System C.

In this manner, evaluation of a performance such as a processor load ratio can be carried out by simulating the entire system including both of the software and the hardware.

It is to be noted that also a technique is conventionally available wherein simulation is executed in order to create software (application) (for example, refer to Japanese Patent Laid-Open No. 2002-215423 and Japanese Patent Laid-Open No. 2006-59108).

An example of a conventional performance evaluation simulation apparatus for a semiconductor device is shown in FIG. 14. In the conventional simulation apparatus 100, a Central Processing Unit (CPU) 101, an I-cache (instruction cache) 102, a D-cache (data cache) 103, a bus 104, an external RAM (Random Access Memory) 105 and peripheral HW (HardWare) 106 are implemented by a hardware model.

It is to be noted that the CPU 101 includes an ISS 110 for executing software, an access processing section 111 for executing access to the outside and a data totalization section 112 for totalizing statistical information 120 as a result of simulation.

However, the conventional simulation apparatus 100 executes software 122 to be actually incorporated in the processor and based on specifications 121 as described above on the ISS 110. Therefore, in order to carry out the verification with high accuracy, a sufficient degree of completeness of the software 122 is required, and examination for optimization, that is, performance evaluation simulation, cannot be carried out at an early stage of the design.

Further, where the simulation is executed, there is a problem that the ISS 110 occupies the greater part of the simulation and the execution time becomes very long.

Therefore, a technique is conventionally available wherein software to be executed on a processor is modeled using a UML analysis to produce software so as to allow verification at an early stage of the design. Also another technique is conventionally available wherein a function model and software are produced from requested specifications or a conceptual model (refer to, for example, Japanese Patent Laid-Open No. 2001-318812 and Japanese Patent Laid-Open No. 2007-310449, hereinafter referred to as Patent Documents 3 and 4, respectively).

However, since such techniques as disclosed in Patent Documents 3 and 4 involve modeling of an application program from a document of requested specifications, a considerable number of man-hours are required before production of software and much time is required.

Further, since estrangement from software to be actually incorporated, or in other words, accuracy of a performance verification environment, is not known in such techniques as disclosed in Patent Documents 3 and 4, it is not known whether produced software is reliable.

SUMMARY

According to an aspect of the embodiment, there are provided a simulation apparatus and a simulation method wherein a first acquisition section executes existing tentative software to acquire a first execution log and a division section divides the first execution log into a plurality of basic processing units. Then, a basic processing execution log production section modifies some of the plural basic processing units to produce a basic processing execution log to be used for simulation. Then, a simulation execution section inputs the basic processing execution log to a hardware model to execute the simulation to acquire information required for the performance evaluation.

According to a further aspect of the embodiment, there is provided a recording medium on or in which a simulation program for causing a computer to function as the first acquisition section, division section, basic processing execution log production section and simulation execution section described above is recorded.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 is a view illustrating a process by a flag processing section of the simulation apparatus as the embodiment;

FIG. 3 is a view illustrating an example of an execution log acquired by a first acquisition section of the simulation apparatus as the embodiment;

FIG. 4 is a view illustrating an example of an object sequence produced by an easy software model production section of a basic process execution log production section of the simulation apparatus as the embodiment;

FIG. 5 is a view illustrating an example of an easy sequence diagram corresponding to part of the object sequence illustrated in FIG. 4;

FIGS. 11A and 11B are views illustrating an example of a process of the easy software model production section of the basic process execution log production section of the simulation apparatus as the embodiment, and wherein FIG. 11A illustrates a basic process before the easy software model production section carries out the process and FIG. 11B carries out a basic process after a process for producing an abstraction model is carried out in the basic process shown in FIG. 11A;

DESCRIPTION OF THE PREFERRED EMBODIMENTS

In the following, embodiments of the present invention are described with reference to the drawings.

[1] Embodiment of the Present Invention

Figure 1:
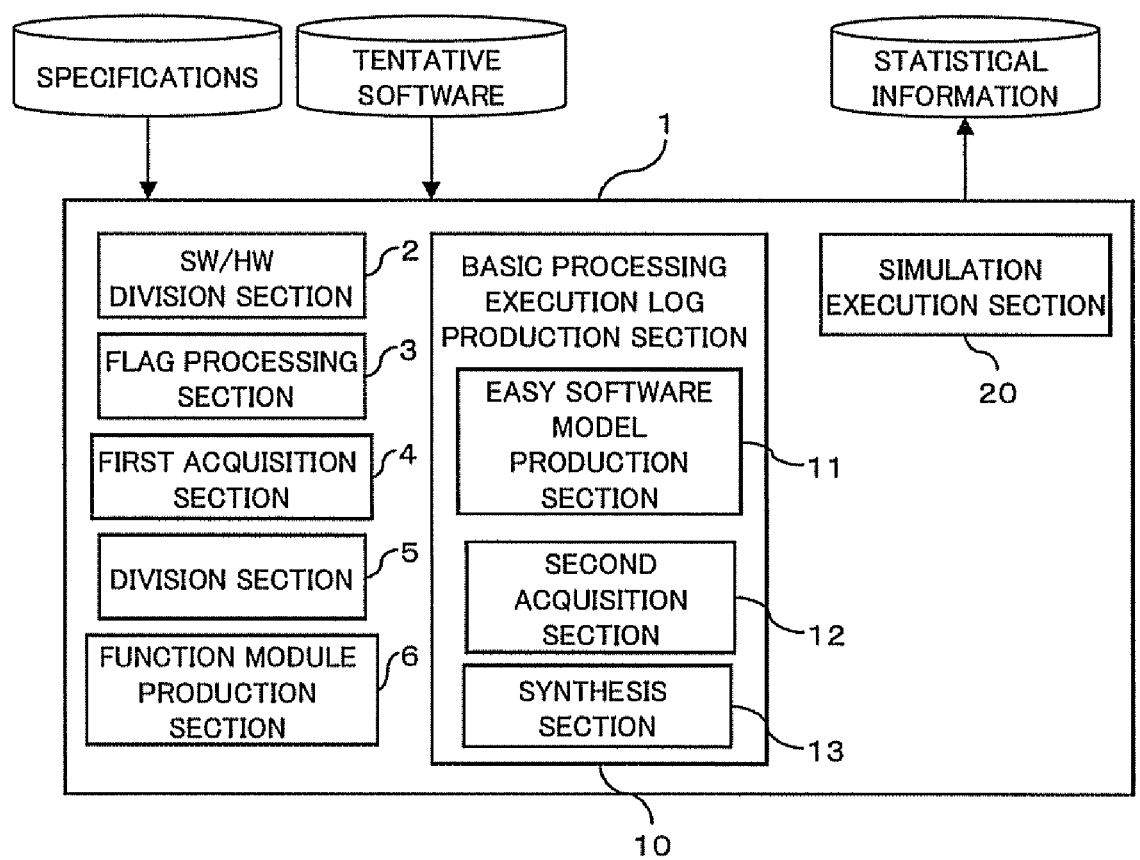
FIG. 1 is a block diagram showing a configuration of essential part of a simulation apparatus as an embodiment.

First, a configuration of a performance evaluation simulation apparatus (hereinafter referred to as present simulation apparatus) 1 as an embodiment of the present invention is described with reference to a block diagram shown in FIG. 1.

The present simulation apparatus 1 is used for evaluating a performance of hardware (for example, a CPU) to be incorporated in a semiconductor device such as, for example, an LSI. The simulation by the present simulation apparatus 1 is executed based on an execution log which is an execution history obtained by executing software without using an ISS.

In particular, the present simulation apparatus 1 relates to modeling of software and hardware for evaluating a performance of the hardware and provides modeling of the software wherein software design assets in the past can be practically used so that architecture verification of a target CPU can be carried out with a degree of abstraction with which cash analysis can be carried out without the necessity for an ISS.

Here, the execution log (execution instruction sequence) is a history of instructions actually executed when software is executed by an ISS for a target CPU or the like.

The present simulation apparatus 1 includes an SW (SoftWare)/HW (HardWare) division section 2, a flag processing section 3, a first acquisition section 4, a division section 5, a function module production section 6, a basic process execution log production section 10 and a simulation execution section 20.

The SW/HW division section 2 divides, based on specifications of a system which is a simulation target, a process determined depending upon the specifications or the specifications into a process of software and another process of hardware.

The flag processing section 3 embeds a branch line of a source code and/or a flag which indicates a function line for calling an object in existing tentative software produced in advance and to be used for production of a basic process execution log hereinafter described by the basic process execution log production section 10 into a position of the tentative software just in front of or just behind the line.

For example, where the tentative software is configured in such a manner as illustrated in FIG. 2, the flag processing section 3 embeds a flag for carrying out read accessing to a predetermined address into a position just behind an "if" statement and an "else" statement which indicate a branch line of a source code. The flag processing section 3 here inserts, as flags, "DT_READ(addr1,offset,data)" for reading "addr1+offset", "DT_READ(addr2,offset,data)" for reading "addr2+offset" and "(DT_READ(addr4,offset,data)" for reading "addr4+offset".

Further, the flag processing section 3 here inserts "DT_READ(addr3,offset,data)" for reading "addr3+offset" as a flag into a position just in front of a function line for calling an object such as "ex_test0(num);".

By inserting the flag by means of the flag processing section 3 in this manner, the read access to a designated address can be acquired as flag information in an execution log obtained by executing the tentative software on actual machine or an ISS. Then, automatic extraction of an object transition graph (object sequence diagram) and a source code between flags of objects illustrated in FIG. 6 and hereinafter described can be carried out based on the flag information. As a result, an easy software model production section 11 hereinafter described can produce easy software.

It is to be noted that the flag processing section 3 automatically specifies a branch line, for example, based on "if" or "else" in the tentative software and automatically embeds a flag. Further, the flag processing section 3 automatically specifies a predetermined function based on regularity (for example, a naming method for a function) where the function for calling an object has some regularity, in the example of FIG. 2, based on "ex". Then, the flag processing section 3 automatically embeds the flag into a position just in front of or just behind the specified function.

The first acquisition section 4 executes the tentative software for diversion produced in advance on an actual machine or an ISS to acquire an execution log (first execution log) of the tentative software.

Here, an example of an execution log to be acquired by the first acquisition section 4 is illustrated in FIG. 3.

Information of the execution log in FIG. 3 includes, principally for each process, a time stamp as execution time information ("time" in FIG. 3), a designation of instruction/data access ("type" in FIG. 3), a designation of read/write in the case of data access, an object in the case of an instruction ("Object(¥#line)"; object file), and an address. It is to be noted that, if this object is referred to, then it is recognized what source file the processing executes.

Further, the first acquisition section 4 acquires also execution information (the number of execution lines of source codes) of the calling function between actual objects of the processes in order to produce an easy software model hereinafter described. A popular integrated development tool including an emulator and an ISS has the information acquired by the first acquisition section 4 as a debug function.

It is to be noted that, since, where the tentative software is communication processing software, the number of instruction address strings and data access strings which indicate a processing amount of the execution log is varied also by changing the transfer rate, attention must be paid to a simulation condition on a target processor.

Figure 6:
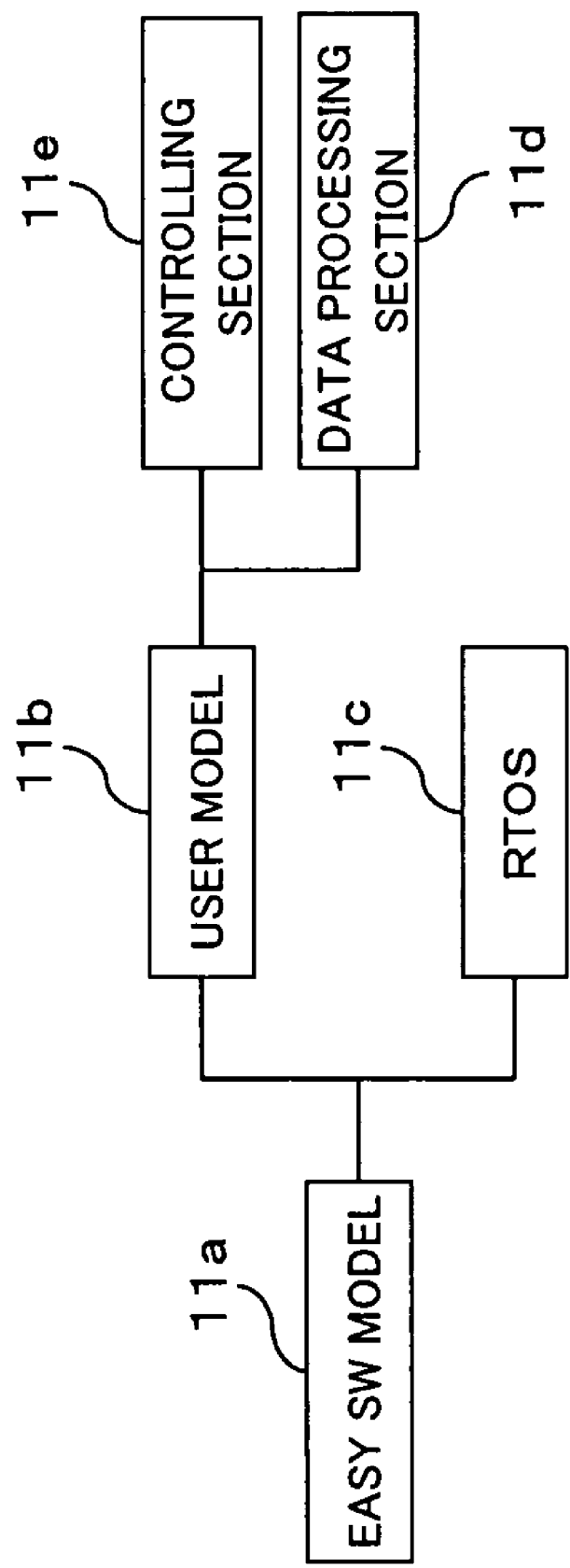
FIG. 6 is a view showing an easy software model produced by the easy software model production section of the basic process execution log production section of the simulation apparatus as the embodiment.

The division section 5 divides the execution log acquired by the first acquisition section 4 into a plurality of basic processing units. It is to be noted that the basic processing unit is an execution unit of a process to be executed by a software model. In particular, a basic processing unit is illustrated in FIG. 6 as hereinafter described.

Since, for example, in the case of an application of a multimedia process or a communication process, one process is in most cases carried out repetitively, the division section 5 finds out a task starting point of the OS from a pattern of a cyclical process and carries out division in a unit of a task based on the found out task starting point. Or, the division section 5 monitors a flow of a process between object files from an instruction address column and finds out a delimiter of a task and then performs the division.

Here, the division section 5 produces an object sequence as illustrated in FIG. 4 and extracts a pattern of a periodical process so that the execution log is divided into a plurality of basic processing units.

FIG. 5 is a view illustrated an example of the object sequence table illustrated in FIG. 4. In FIG. 5, "xxx.o", "yyy.o" and "zzz.o" individually indicate an object.

As seen in FIG. 5, each basic processing unit Fn[1] is extracted as one interval from a starting point to an ending point of the access between object files.

The function module production section 6 produces a function module to be used for the simulation to be executed by the simulation execution section 20 in response to the basic processing units divided by the division section 5. Details of the function module are described with reference to FIG. 7 hereinafter described.

The basic process execution log production section 10 modifies some of the plural basic processing units to produce the basic process execution log to be used for the simulation.

In particular, the basic process execution log production section 10 includes the easy software model production section 11, a second acquisition section 12 and a synthesis section 13.

The easy software model production section 11 extracts a basic processing unit (changing target basic processing unit) which is a modification target from among the plural basic processing units obtained by the division section 5 based on the instruction from the operator and produces the easy software model based on the extracted modification target basic processing unit.

In particular, the easy software model production section 11 extracts a basic processing unit (modification target basic processing unit) corresponding to a process to be modified from the tentative software and modifies the extracted basic processing unit to produce a basic processing unit corresponding to new software to be applied to the target CPU.

A configuration of easy software (easy software model) 11*a* is illustrated in FIG. 6. The easy software model 11*a* is configured roughly from a user model 11*b* and a real-time OS (RTOS) 11*c*. The user model 11*b* is configured from a data processing section 11*d* for carrying out succession, repetition and selection processes of a data structure started in response to an event flag and including data access to a RAM and a controlling section 11*e* such as an initialization sequence and a processing sequence to be called by a system call during data processing.

The easy software model production section 11 extracts and modifies a portion corresponding to the user model 11*b* as a modification target.

Figure 10:
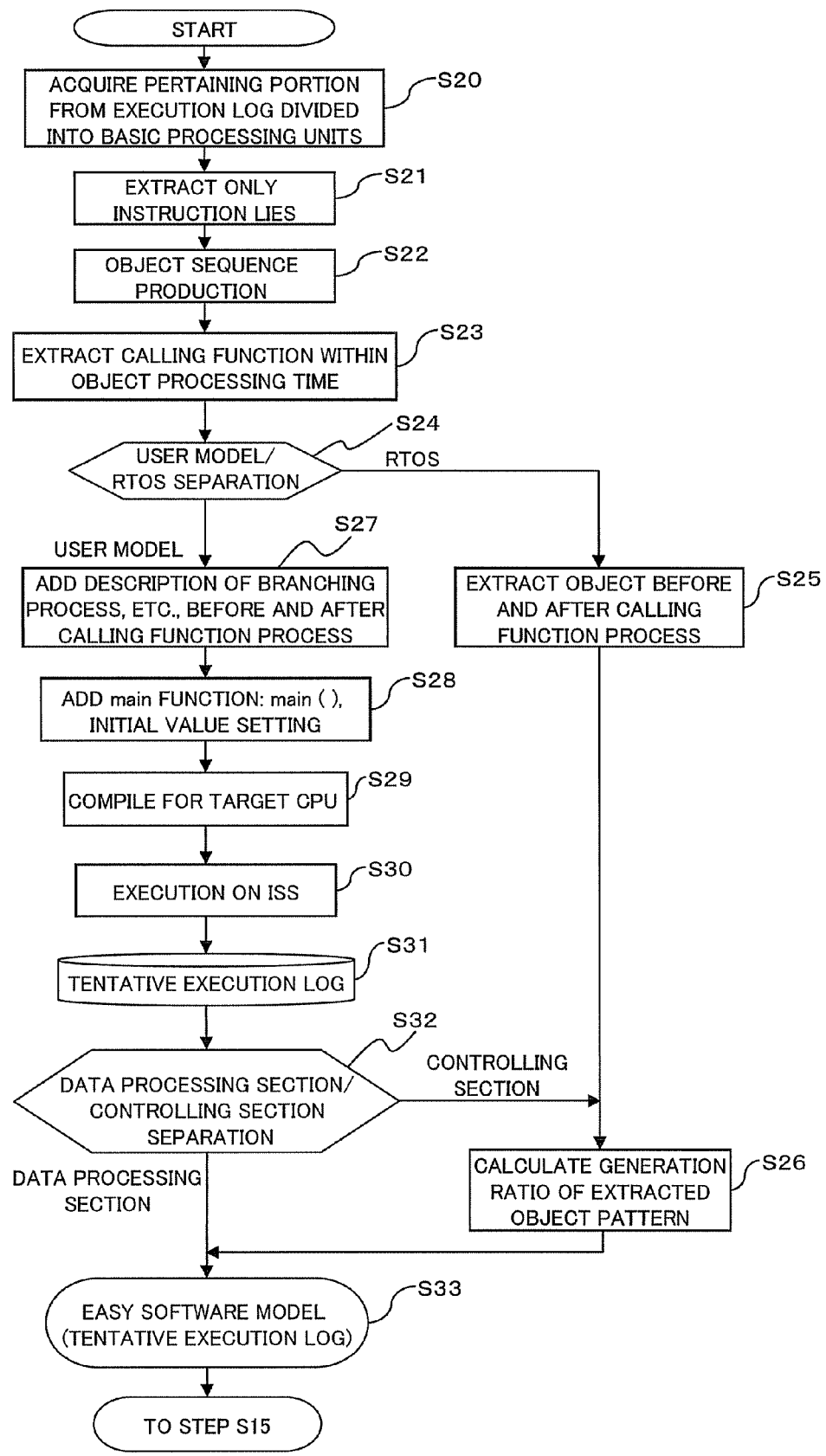
FIG. 10 is a flow chart illustrating an example of an operation procedure of the easy software model production section of the basic process execution log production section of the simulation apparatus as the embodiment.

It is to be noted that more detailed contents of operation of the easy software model production section 11 are hereinafter described with reference to a flow chart of FIG. 10.

The second acquisition section 12 executes the easy software model 11*a* produced by the easy software model production section 11 on an actual machine or an ISS to acquire an execution log (tentative execution log) which is the execution history of the easy software model 11*a*.

The synthesis section 13 synthesizes basic processing units other than the modification target basic processing units from among the plural basic processing units divided by the division section 5 and the tentative execution log to produce a basic process execution log.

The simulation execution section 20 carries out simulation using the basic process execution log produced by the basic process execution log production section 10 to acquire statistical information for performance evaluation of the target CPU.

In particular, the simulation execution section 20 inputs the basic process execution log to the hardware to execute the simulation to acquire the information (statistical information) required for the performance evaluation.

Figure 7:
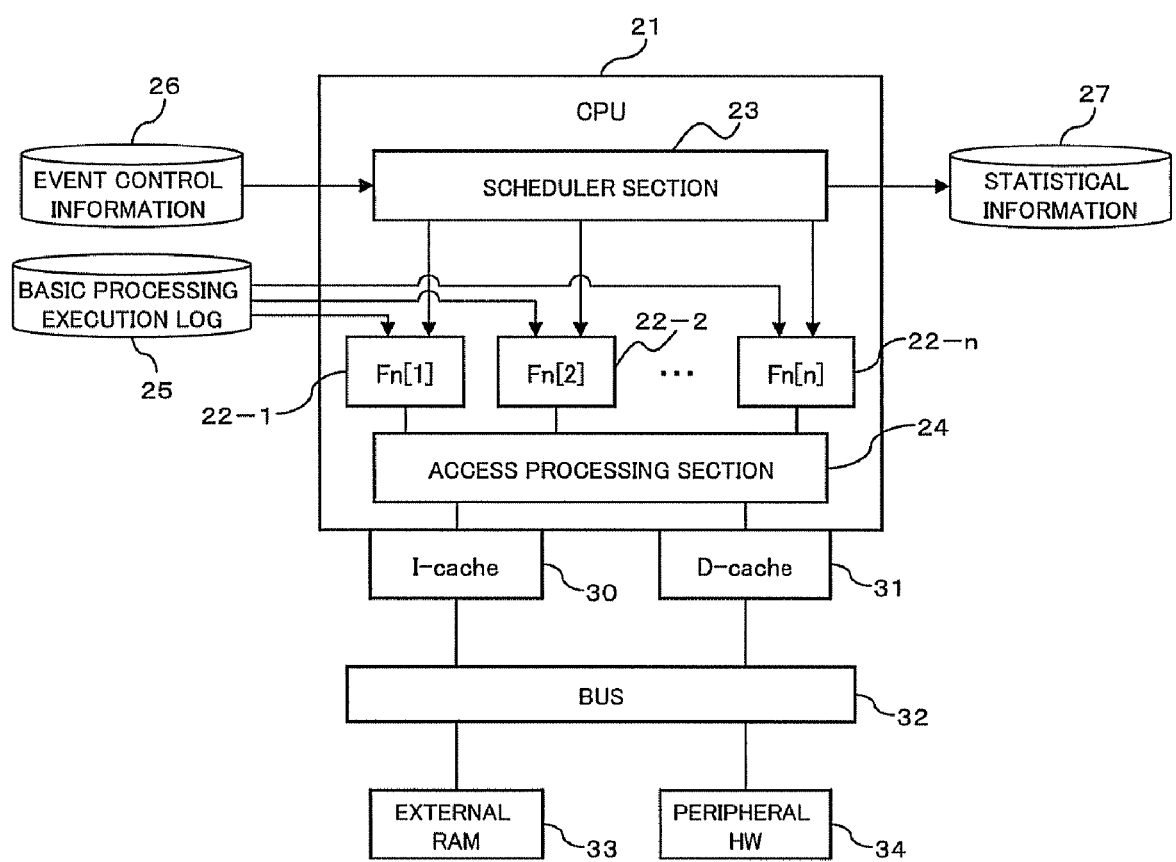
FIG. 7 is a block diagram showing an example of a configuration of a simulation target implemented by a simulation execution section of the simulation apparatus as the embodiment.

A target (hardware model) of the performance evaluation simulation to be implemented by the simulation section 20 is described with reference to FIG. 7.

In particular, all of the CPU 21, I-cache (instruction cache) 30, D-cache (data cache) 31, bus 32, external RAM 33 and peripheral hardware (HardWare; represented as "peripheral HW" in FIG. 7) 34 are a target of the performance evaluation simulation.

The CPU 21 is a target processor which is a target of the performance evaluation. By checking the hardware performance when the software is executed on the CPU 21, performance verification of the CPU 21 can be carried out.

The CPU 21 is configured from function modules 22-1 to 22-*n* (here, n indicates an integer of 3 or more) configured from the basic process unit, a scheduler section 23 and an access processing section 24.

The function modules 22-1 to 22-*n* (hereinafter referred to as function modules 22 where the function modules 22-1 to 22-*n* are not distinguished from each other) receive an input of the basic process execution log 25 which is a log analysis file of a basic processing unit extracted from the execution log.

The function modules 22 individually function in CPU 21 as a basic processing unit which is an actual unit of a process to be executed on the software model divided by the access processing section 24 based on the execution log.

In particular, the inputted basic process execution log belongs to one of the function modules 22, and a basic processing execution log is selected upon execution where a plurality of logs belong to one function block.

The scheduler section 23 reads event controlling information 26 and requests process processing to the corresponding function module 22 based on the event controlling information.

The event controlling information 26 is obtained from the execution log acquired by the first acquisition section 4 and is formed from a file including a parameter representing that a specific event occurs at a specific time.

Then, the scheduler section 23 inputs the basic process execution log to the corresponding function module 22 based on the event controlling information 26.

In particular, the simulation execution section 20 inputs the basic process execution log to the hardware model based on the event controlling information in the execution log.

Then, the scheduler section 23 produces statistical information 27 to be used for performance evaluation from the simulation process executed by the access processing section 24.

For example, the scheduler section 23 acquires and produces instruction execution time (ns), instruction fetch time (ns), data access time (ns) and a CPU load factor (%) as the statistical information 27 for each basic processing unit, that is, for each function module 22. In particular, since the execution log has an instruction address string and an address string for data access, the simulation execution section 20 can execute bus access through the instruction cache and the data cache, and as a result, the instruction execution time, instruction fetch time, data access time and so forth can be monitored to produce statistical data of the CPU load factor and so forth.

The access processing section 24 executes access to the I-cache 30 or the D-cache 31 in response to an instruction fetch or data access process from the function module 22.

Here, the I-cache 30 is an instruction cache for shortening the acquisition time of an instruction existing on the external RAM 33. Also the D-cache 31 is a data cache for shortening the time for data access similarly to the I-cache 30. The D-cache 31 is different from the I-cache 30 in that it is ready not only for readout but also for writing.

The I-cache 30 and the D-cache 31 are connected to the bus 32. In the present embodiment, also the external RAM 33 and the peripheral HW 34 are connected to the bus 32. It is to be noted that the external RAM 33 is connected to the outside of the CPU 21 through the bus 32. The peripheral HW 34 is an external I/F, exclusive hardware for a specific application or the like.

The simulation execution section 20 constructs a portion other than the input of the basic process execution log, for example, with a transaction level using the System C language.

Figure 8:
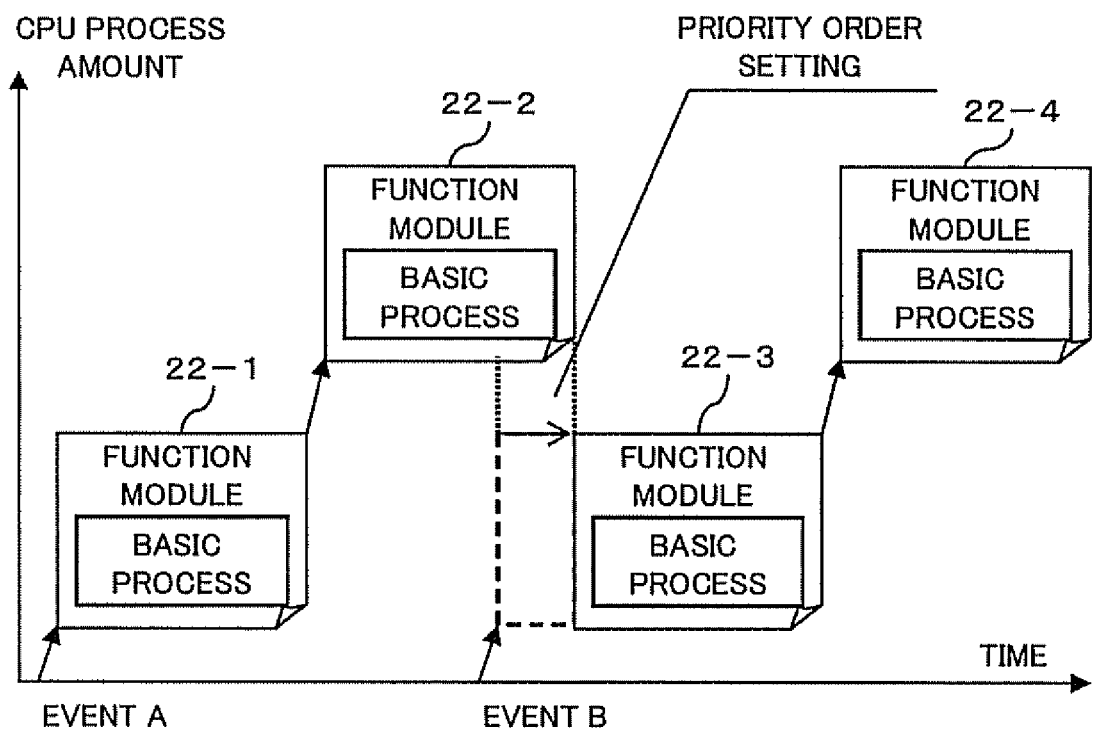
FIG. 8 is a diagrammatic view illustrating an example of execution of periodical events in simulation by the simulation execution section of the simulation apparatus as the embodiment.

Here, a manner wherein the CPU 21 (CPU model) periodically carries out an event in the simulation by the simulation execution section 20 is illustrated in FIG. 8.

Process processing of each event is configured from a plurality of basic processes. For example, if a periodical event A occurs in accordance with a frequency applied in advance as a parameter, then the scheduler section 23 in the CPU 21 calls the function module 22-2 together with the function module 22-1 in response to the occurrence of the periodical event A.

The called function modules 22-1 and 22-2 individually execute the execution log of a corresponding basic process. A priority order is applied in advance to events and basic processes by requested specifications or the like so that time collision between the events or the basic processes is avoided. In the example in FIG. 8, the scheduler section 23 carries out control so that the event A and the succeeding event B do not collide with each other.

It is to be noted that the function module 22 not only carries out a common process for collecting statistical information data such as instruction fetch, memory access instruction time consumption and so forth necessary for performance evaluation but also carries out description of a function unique to each module in accordance with the degree of completeness of hardware.

Figure 9:
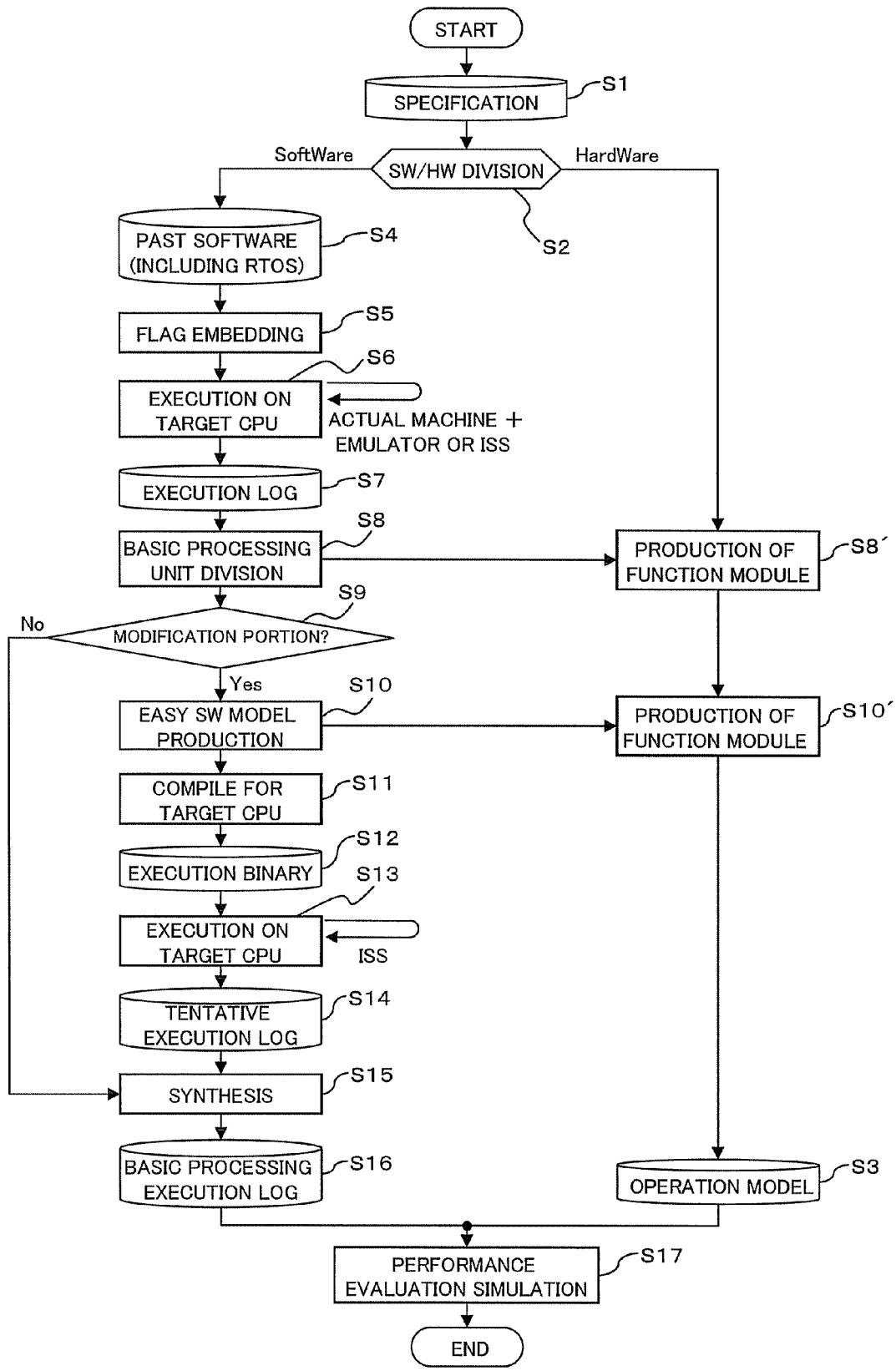
FIG. 9 is a flow chart illustrating a processing procedure of a simulation method as the embodiment.

Next, an outline of an operation procedure of the present simulation apparatus 1, that is, a simulation method as the embodiment of the present invention, is described with reference to a flow chart (steps S1 to S17, S8', S10') of FIG. 9.

First, the present simulation apparatus 1 receives an input of requested specifications of a system relating to hardware (hereinafter referred to as target CPU) which is a performance evaluation target and software to be incorporated in the target CPU (step S1). It is to be noted that, while a function model for verifying functions is sometimes produced, description of production of a function model is omitted here.

Next, the SW/HW division section 2 divides a process generated based on the requested specifications into a process for the software and another process for the hardware (a software model and a hardware model) (step S2).

Here, the simulation execution section 20 produces an operation model relating to the hardware (step S3). It is to be noted that the operation model is produced by description which includes the RTL, the TLM having a high degree of abstraction, or both of the RTL and TLM.

On the other hand, as the software in the embodiment, existing software (software in the past) produced in the past as tentative software capable of producing a sufficient load for performance evaluation is used (step S4). In particular, a source code of an existing model which is a diversion design source is utilized. Here, a case wherein a real-time OS (RTOS) is utilized is described.

Then, the flag processing section 3 embeds a flag into the tentative software as described hereinabove with reference to FIG. 2 (step S5; flag processing step).

Then, the first acquisition section 4 compiles the tentative software as software for a target processor and produces an execution binary. An ISS on an actual machine or a calculator through an emulator and a calculator including an OS for acquiring an execution history (execution log) of instructions are used as a software execution environment to actually execute the software so that the execution log is acquired (steps S6 and S7; first acquisition step).

Next, the division section 4 divides the acquired execution log into basic processing units (step S8; division step).

It is to be noted that, together with the extraction of the basic processing units, the function module production section 6 produces a corresponding function module in the hardware (step S8').

Then, the easy software model production section 11 of the basic process execution log production section 10 selects a processing portion to be modified from existing functions of the tentative software regarding the execution log divided into the basic processing units (step S9), and produces the easy software model 11a regarding the modification portion (Yes route of step S9) (step S10).

Here, the easy software model 11a is a model wherein the degree of abstraction where functions to be described in the request specifications are incorporated as they are is described, and particularly, the easy software model 11a is a model wherein processes such as a branching process for error detection, internal state transition, internal variable retention and so forth are omitted.

A detailed procedure for producing the easy software model 11a from the execution log is hereinafter described with reference to FIG. 10.

It is to be noted that, at this time, the function module production section 6 carries out correction of the function module of the hardware when necessary in conformity with the easy software model produced by the easy software model production section 11 (step S10').

Then, the second acquisition section 12 compiles the produced easy software model as a model for the target processor (step S11) and produces an execution binary (step S12). Thereafter, the second acquisition section 12 executes the execution binary on the ISS for the target processor (step S13) and acquires an execution history (tentative execution log) of actually executed instructions (step S14).

Then, the synthesis section 13 synthesizes the execution log on the basic processing unit of an existing portion which is not selected as the modification portion at step S9 and the tentative execution log (step S15) and produces the basic process execution log (step S16).

Finally, the simulation execution section 20 executes the performance evaluation simulation of the target CPU 21 using the basic process execution log and the operation model (step S17; simulation execution step) and then the processing ends. Here, the simulation execution section 20 applies the execution log of the basic processing unit as an input to the operation model together with parameter setting such as a frequency to execute the performance evaluation simulation.

Now, a more detailed operation procedure (flow of an easy software model) of the easy software model production section 11 is described with reference to a flow chart (steps S20 to S33) of FIG. 10.

The easy software model production section 11 extracts and acquires a processing portion to be newly modified from among the plural basic processing units obtained by dividing the execution log of the tentative software by the division section in accordance with the procedure illustrated in FIGS. 3 to 5 (step S20).

Then, the easy software model production section 11 extracts only an instruction processing line other than the data access from the execution log to produce data (step S21). Further, the easy software model production section 11 produces the object sequence table shown in FIG. 4 based on object information added in advance (step S22).

Or, the easy software model production section 11 can produce an object sequence also by adding object information from an instruction address string.

Then, the easy software model production section 11 extracts a calling function to be executed during processing time of each object from the execution log in accordance with an object sequence and a time stamp ("time" in FIG. 4) (step S23).

Thereafter, the easy software model production section 11 classifies whether the extracted function relates to the user model 11a or the RTOS 11b in response to the object to which each function is to be accessed (step S24). In particular, the easy software model production section 11 refers to the object to which each calling function accesses to decide whether the function relates to the user model 11a or the RTOS 11b.

Regarding the function relating to the RTOS 11b, the easy software model production section 11 extracts objects in front of and behind the calling function process (step S25) and calculates a pattern generation ratio of the extracted objects (step S26).

Since the processes described are included in the execution log similarly to the user model 11a, logs at similar portions are connected to each other referring to existing portions. In particular, the easy software model production section 11 extracts RTOS objects in front of and behind the calling function process based on the time stamp of the execution process of the basic process and calculates a generation frequency of an object pattern from the execution log acquired by the first acquisition section 4 and then applies a coefficient for determining the generation ratio of each object to produce the pattern generation ratio.

It is to be noted that the pattern generation ratio is used as part of the event controlling information 26 for control of the schedule section 23.

On the other hand, regarding the user model 11b, the easy software model production section 11 extracts necessary description from source codes of the existing tentative software which is a diversion source regarding the data processing section 11d and the controlling section 11e of the user model 11b based on a correlation of the object sequence of FIG. 4 and the execution information of the calling function to produce an abstracted model of a function level (steps S27 and S28).

Here, the necessary description is complementation of the processes of the calling function and of portions in front of and behind of a line from which the calling function is read out and a flow of a branch (step S27), and an "if" statement for anomaly detection and an internal state transition process are omitted.

For example, the easy software model production section 11 carries out the complementation for portions just behind a function "#100" of a time stamp "30530" and just in front of a function "#398" of a time stamp "30539" in the object sequence table shown in FIG. 4. Further, the easy software model production section 11 carries out the complementation for portions just behind a function "#406" of a time stamp "30557" and just in front of a function "#174" of a time stamp "30572".

Figure 11B:
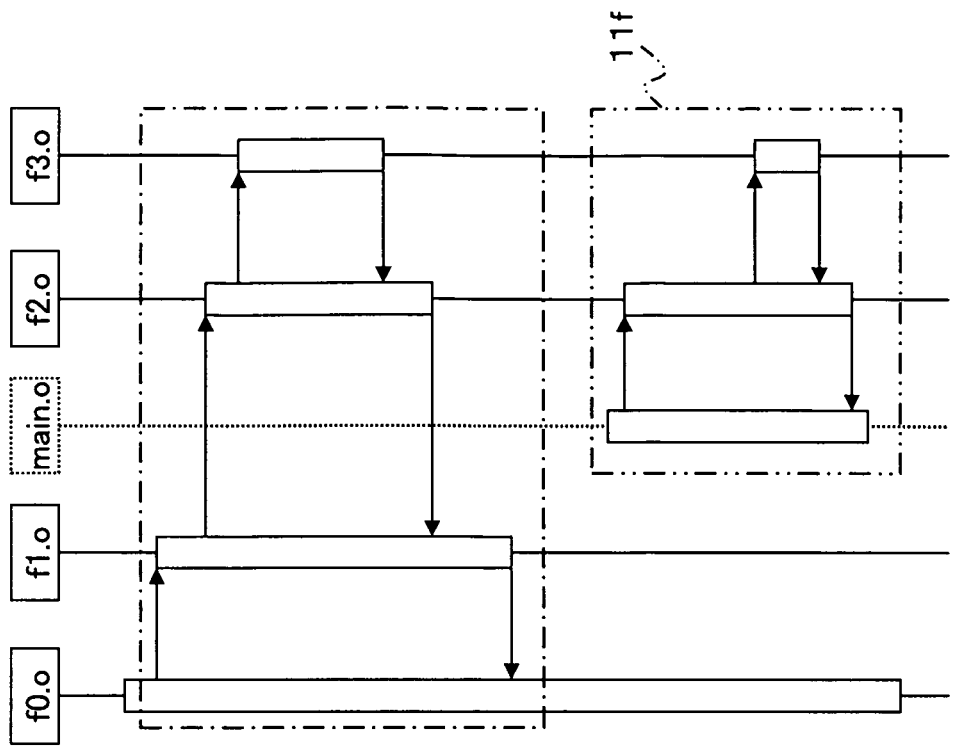
Figure 11A:
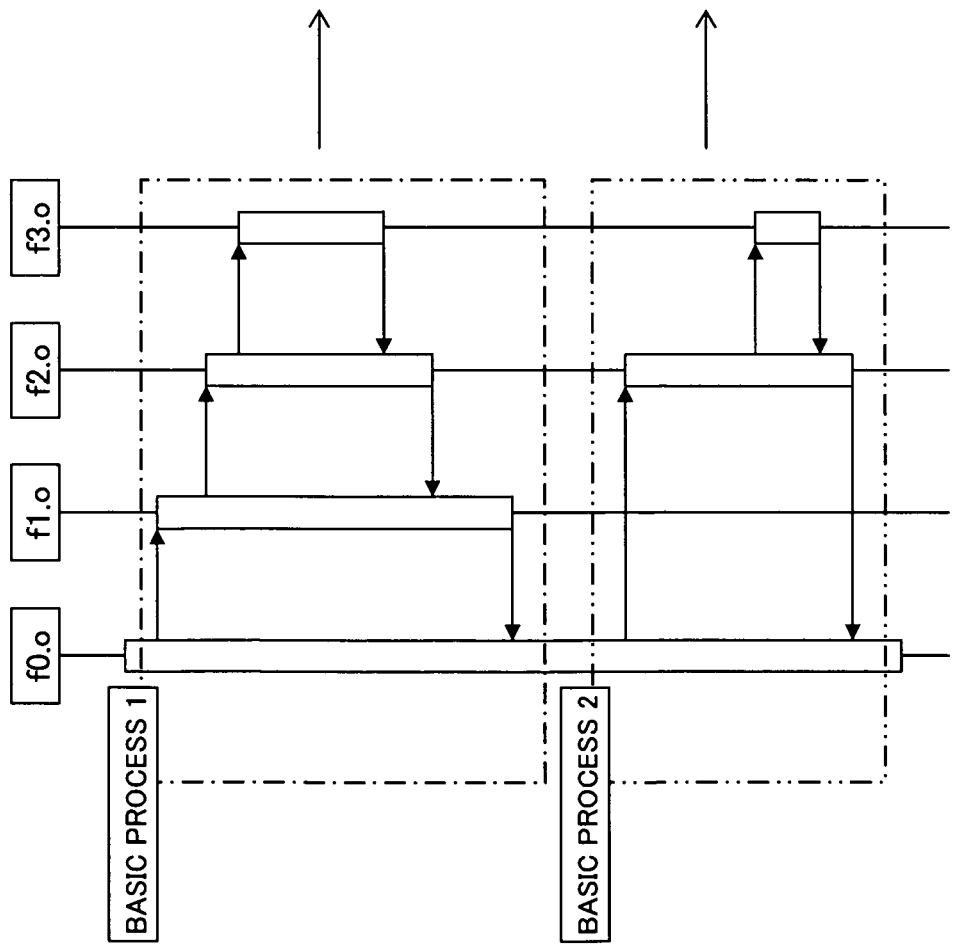

Further, the easy software model production section 11 adds a "main" function for controlling the start and the end of the cut out basic process to the source codes of the abstracted model produced in accordance with the procedure described above (step S28). For example, the easy software model production section 11 adds a "main" function "main.o" between functions "f1.o" and "f2.o" in the basic processes 1 and 2 illustrated in FIG. 11A as seen in FIG. 11B. Consequently, the basic processes can be utilized as an abstracted model 11f which operates independently without carrying out data cooperation with a layer of a peripheral process.

In this manner, the easy software model production section 11 produces the data processing section 11d of the easy software model 11a from the object sequence of the execution log.

It is to be noted that the easy software model production section 11 sets not only calling of the basic process described above but also an address and data of RAM access to be called in an object and a variable to be incorporated in an object other than the basic process as initial values in the "main" function. Consequently, the accurate number of instructions and data accesses of the basic processing portion can be grasped by the second acquisition section 12 by removing the processes of the object "main.o" from the execution log extracted by compiling the basic process and executing the compiled basic process on the target processor.

It is to be noted that, regarding the address of the RAM access, the easy software model production section 11 allocates a suitable address in the RAM region based on the memory map of the existing tentative software which is a diversion source. Further, the easy software model production section 11 allocates a suitable value as a variable other than that relating to the basic process similarly to the address just described.

In this manner, the basic process execution log production section 10 modifies the basic processing unit obtained by the tentative software based on the tentative software to acquire the execution log corresponding to new software to be incorporated in the target CPU.

Then, the second acquisition section 12 carries out a compile process (step S29) and execution (step S30) to acquire a tentative execution log (step S31).

Then, the basic process execution log production section 10 divides the tentative execution log into a portion of the tentative execution log relating to the data processing section 11$d$ and another portion of the tentative execution log relating to the controlling section 11$e$ (step S32).

Here, the basic process execution log production section 10 decides, based on the time stamp of the tentative execution log, that a periodical portion of the tentative execution log relates to the data processing section 11$d$ and that a non-periodical portion of the tentative execution log relates to the controlling section 11$e$.

Then, similarly to the RTOS 11$c$ described hereinabove, the basic process execution log production section 10 calculates a pattern generation ratio of the portion relating to the controlling section 11$e$ and outputs the calculated pattern generation ratio (step S26).

In particular, the portion relating to the controlling section 11$e$ is called out by system call and is executed. Since the processing timing of the portion is determined in accordance with the software requested specifications, the processing timing may not possibly be determined upon architecture examination at an early stage of development. Therefore, the basic process execution log production section 10 calculates a generation frequency of an object pattern, that is, a ratio of the number of instructions of the object to the number of all instructions, and an execution period of the object from the existing execution log and applies a coefficient for determining the generation ratio of each object to produce the pattern generation ratio of the controlling section 11$e$.

Then, the tentative execution log acquired at step S31 is outputted to the synthesis section 13. In particular, the basic process execution log production section 10 outputs the portions relating to the data processing section 11$d$ and the controlling section 11$e$ collectively as a tentative execution log (step S33), and the processing advances to a process at step S15 in FIG. 9.

In this manner, with the simulation apparatus 1 and the simulation method as the embodiment of the present invention, the first acquisition section 4 executes the tentative software produced in advance to acquire a first execution log and the division section 5 divides the acquired first execution log into a plurality of basic processing units. Then, the basic process execution log production section 10 modifies some of the basic processing units to produce a basic process execution log to be used for simulation. Then, the simulation execution section 20 inputs the basic process execution log to the hardware model to execute the simulation to acquire information necessary for performance evaluation.

Accordingly, by utilizing tentative software at a stage wherein actual software to be actually incorporated in a target CPU is not completed, performance evaluation of a target CPU can be executed with high accuracy. In particular, the basic process execution log production section 10 modifies an execution log of the tentative software to produce an execution log corresponding to the actual software. Therefore, even if new software to be actually incorporated in the target CPU is not completed, the simulation can be executed with high accuracy at an early stage of the design by practically using software design assets in the past and architecture examination of the target CPU can be carried out. Further, since the existing tentative software is used, modeling of an application program from a document of requested specifications need not be carried out and also the number of steps until the tentative software is produced can be decreased.

Further, by applying a configuration wherein software is divided for each basic function and a load is applied to the hardware model, the degree of abstraction of each function can be changed in response to the degree of progress of the design of the software and the accuracy of the performance evaluation can be further enhanced.

Further, the simulation execution section 20 executes the simulation using the basic process execution log without executing software on an ISS upon simulation. Accordingly, the number of steps relating to the simulation can be decreased and time required for the simulation can be reduced.

In this manner, with the present simulation apparatus 1, the architecture of the system LSI (target CPU) can be examined with high accuracy at an early stage of development and the present invention can greatly contribute to that the processing load and the design margin are suppressed to achieve cost down and downsizing.

Further, in the basic process execution log production section 10, particularly the easy software model production section 11 produces an easy software model and the second acquisition section 12 acquires the tentative execution log of the easy software model. Then, the synthesis section 13 synthesizes a unmodified portion and the tentative execution log, and as a result, an execution log corresponding to the actual software can be produced with certainty and with a reduced number of steps from the existing tentative software.

Further, the flag processing section 2 automatically embeds a flag into the tentative software and the easy software model production section 11 produces an easy software model based on the flag information in the execution log. Therefore, the easy software model production section 11 can carry out production of an object sequence and extraction of a source code at a high speed and with certainty.

Further, since the simulation execution section 20 inputs the basic process execution log to the hardware model based on the event controlling information in the execution log acquired by the first acquisition section 4, the simulation using the basic process execution log can be executed with certainty using the existing resources.

[2] Modifications of the Present Invention

It is to be noted that the present invention is not limited to the embodiment specifically described above, and variations and modifications can be made without departing from the scope of the present invention.

For example, the configuration is applied in the embodiment described above wherein the basic process execution log production section 10 changes the contents of the basic processing units divided by the division section 5 to acquire the execution log corresponding to mounting software based on the tentative software. However, the present invention is not limited to this, and an alternative configuration may be applied wherein the basic process execution log production section 10 replaces the basic processing units divided by the division section 5 with different basic processing units prepared separately to acquire the execution log corresponding to the mounting software.

Here, a case wherein the different basic processing units are replaced based on newly produced software (a case illustrated in FIG. 12 hereinafter described) and another case wherein the different basic processing units are replaced based on different tentative software (another case illustrated in FIG. 13 hereinafter described) are available.

Figure 12:
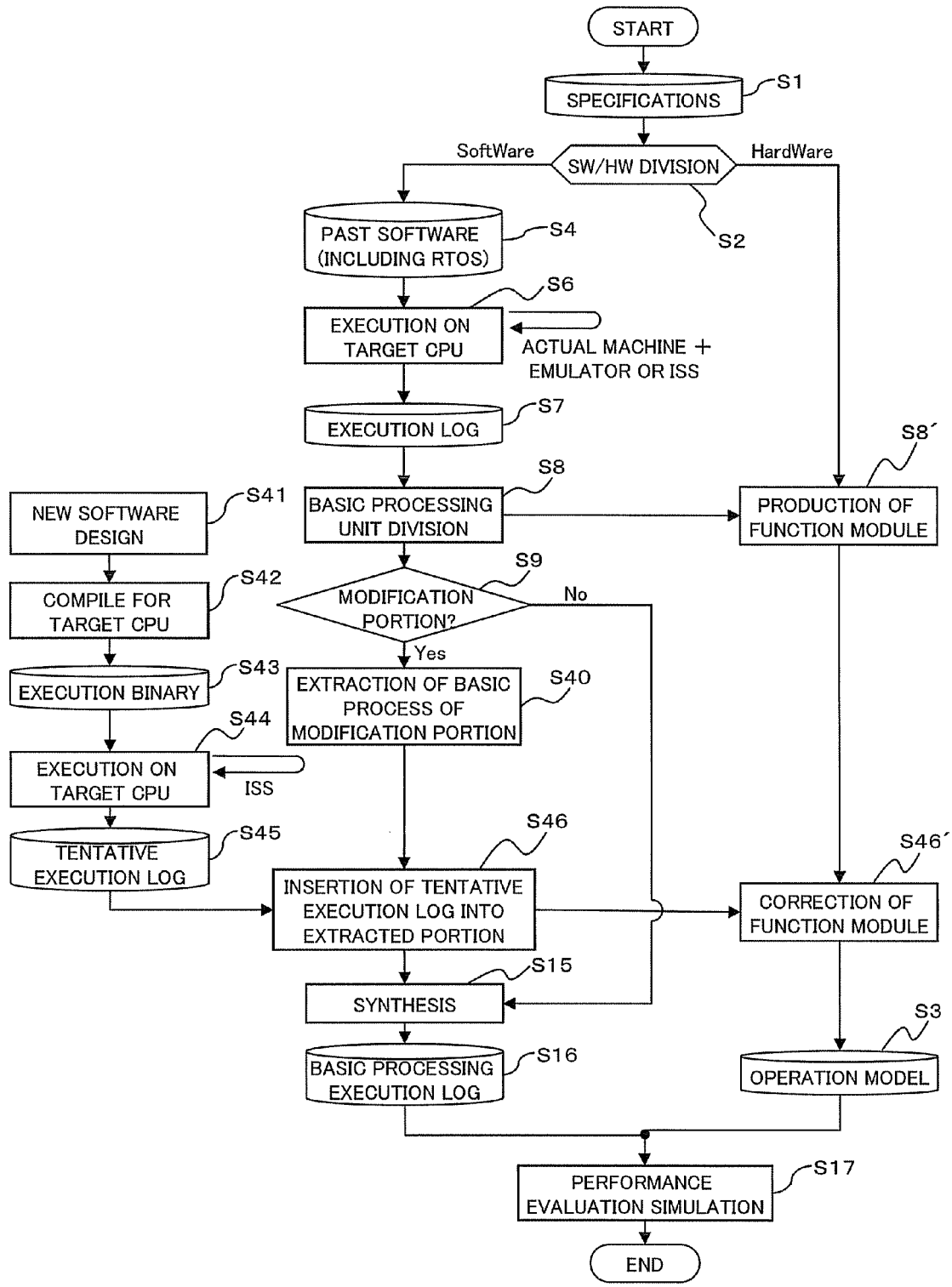
FIG. 12 is a flow chart illustrating a processing procedure of the simulation method as a first modification.

For example, the case wherein the basic processing units are replaced based on newly produced software is described with reference to a flow chart (steps S1 to S4, S6 to S9, S8', S15 to S17, S40 to S46, and S46') of FIG. 12. It is to be noted that like elements to those in FIG. 12 are denoted by like reference characters and overlapping detailed description of them is omitted herein. Further, the flag embedding process (process at step S5 in FIG. 9) is omitted for simplified illustration in FIG. 12 and also in FIG. 13 hereinafter described.

In particular, in the first modification to the present embodiment shown in FIG. 12, the basic process execution log production section 10 extracts a basic process of a modification portion as a modification target (step S40). Then, the basic process execution log production section 10 deletes the extracted basic process or substitutes a different basic process into a portion of the extracted basic process at step S36 hereinafter described.

In particular, the basic process execution log production section 10 acquires a new software design relating to the modification portion in this instance separately from the tentative software (step S41), and the second acquisition section 12 compiles the acquired software design into a design for the target CPU (step S42) and acquires an execution binary (step S43). Then, the second acquisition section 12 executes the execution binary on the target CPU using an ISS to acquire a tentative execution log relating to the modification portion (second execution log) (step S44).

Then, the basic process execution log production section 10 replaces the basic processing unit of the modification portion extracted at step S40 with the tentative execution log acquired at step S45 (step S46) In particular, the basic process execution log production section 10 inserts the tentative execution log into the extracted portion. At this time, the function module production section 6 produces a function module corresponding to the inserted tentative execution log (step S46').

Thereafter, the synthesis section 13 synthesizes the unmodified portion and the tentative execution log (step S15), and the basic process execution log production section 10 produces a basic process execution log (step S16).

In this manner, the basic process execution log production section 10 of the simulation apparatus 1 as the first modification to the present invention substitutes the tentative execution log of new software separately prepared by the operator into part of the execution log of the tentative software to produce a basic process execution log (software model). Consequently, a working effect similar to that in the embodiment described hereinabove can be obtained.

Now, a case is described with reference to a flow chart (steps S4-1, S4-2, S6-1 to S8-1, S6-2 to S8-2, S15, S16, S50 to S53, and S60) of FIG. 13 wherein a basic processing unit is replaced based on tentative software different from that to be diverted at step S4. It is to be noted that like elements to those in FIG. 13 are denoted by like reference characters and overlapping detailed description of them is omitted herein.

Figure 13:
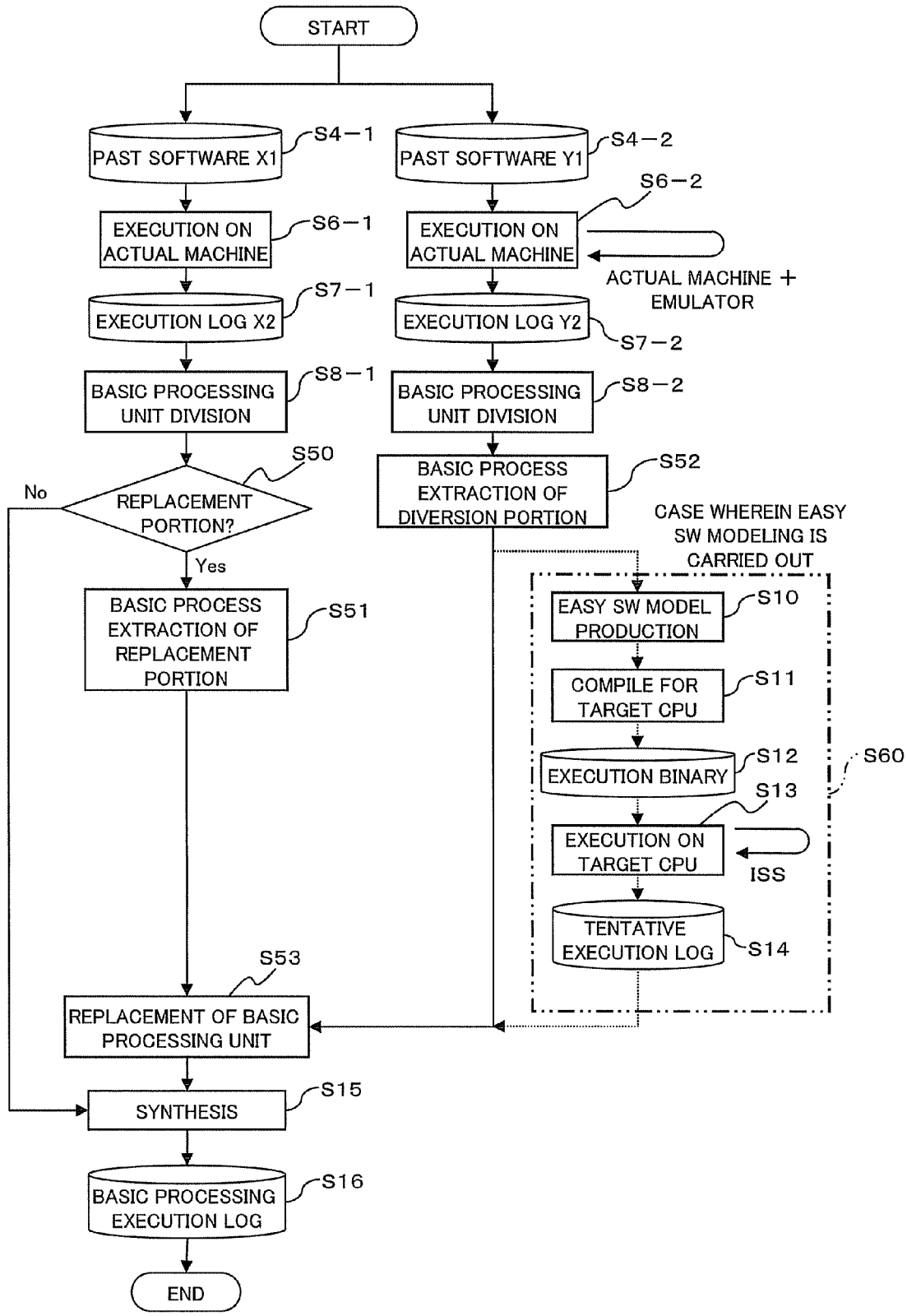
FIG. 13 is a flow chart illustrating a processing procedure of the simulation method as a second modification.
Figure 14:
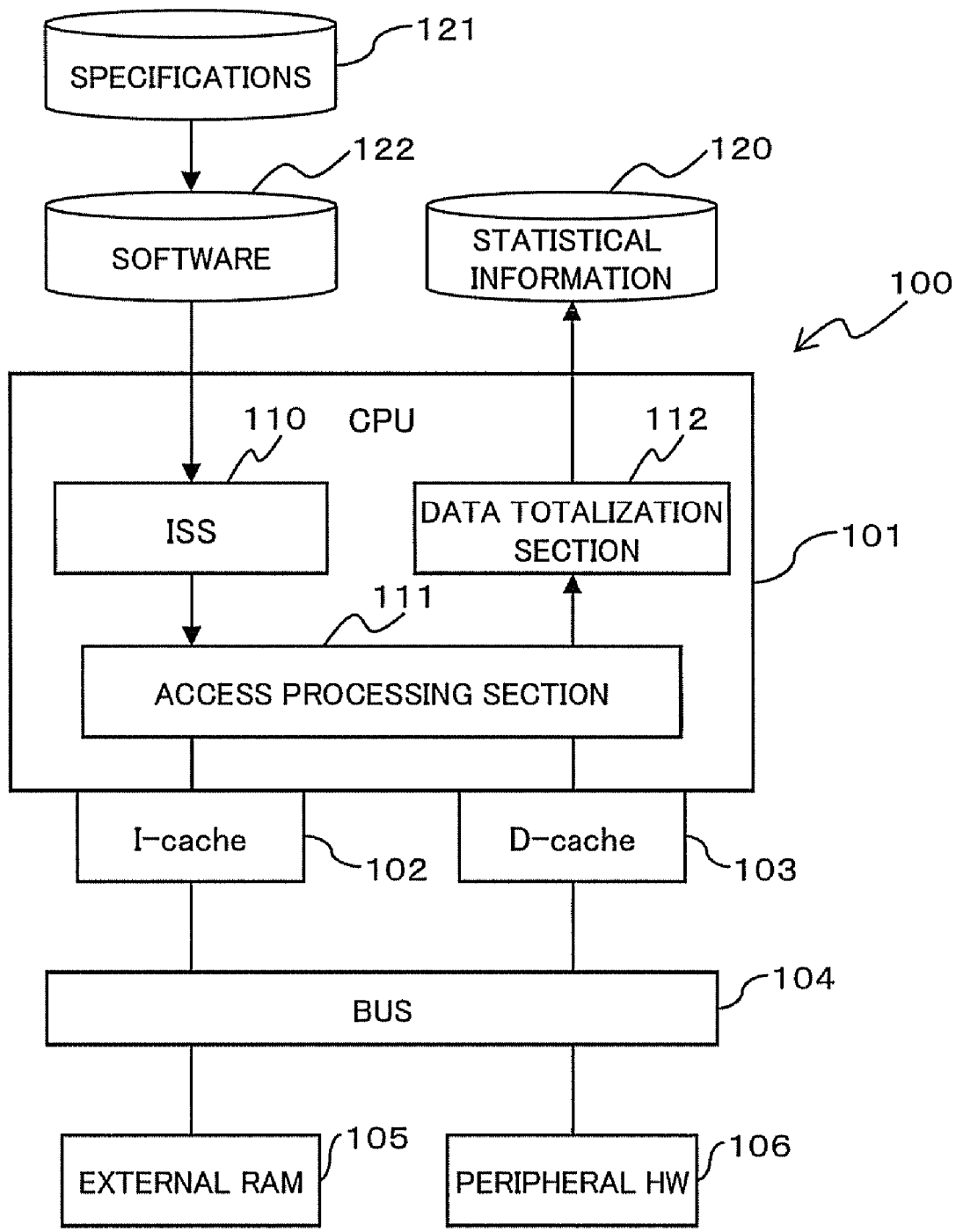
FIG. 14 is a block diagram showing an example of a configuration of a conventional performance evaluation simulation apparatus for a semiconductor device.

In particular, in a second modification to the present invention shown in FIG. 13, the first acquisition section 4 acquires two pieces X1 and Y1 of existing tentative software (steps S4-1 and S4-2) and executes the acquired software on an actual machine (steps S6-1 and S6-2) and then acquires execution logs X2 and Y2 (first and second execution logs) (steps S7-1 and S7-2).

Then, the division section 5 carries out division of the execution logs X2 and Y2 into basic processing units (steps S8-1 and S8-2).

Then, the basic process execution log production section 10 selects a replacement portion in the basic processing unit of the tentative software X1 which is to be used as a base from between the two pieces X1 and Y1 of the tentative software (step S50) and extracts a basic process of the replacement portion (step S51).

On the other hand, the basic process execution log production section 10 extracts a basic processing unit of a diversion portion from the basic processing unit of the tentative software Y1 (step S52).

Then, the basic process execution log production section 10 replaces the extracted basic processing unit with the basic processing unit at the diversion portion (step S53).

Consequently, the basic process execution log production section 10 processes a basic process execution log corresponding to the mounting software from the plurality pieces X1 and Y1 of the existing tentative software.

It is to be noted that, where alteration or addition must be carried out for the function of the diversion portion, an easy software modeling process S60 (steps S10 to S14) indicated by an alternate long and two short dashes line in FIG. 13 is executed to carry out abstraction of the diversion portion to carry out easy software modeling and then the produced easy software model is executed on the target processor to produce a tentative execution log.

Further, the RTOS section extracts execution logs of preceding and succeeding RTOS objects based on execution time of the individual basic processes from the software execution log which is the diversion source. Then, parameters of a generation frequency and an order are applied to the basic process execution logs and the execution logs of the RTOS section produced in accordance with the procedure described above to produce a software load. Consequently, the modeling can be easily carried out at an early stage of the development when some functions of software in the past are transplanted or two or more pieces of software having functions different from each other are integrated.

In this manner, the basic process execution log production section 10 of the simulation apparatus 1 as the second modification to the present invention uses and combines the plural pieces X1 and Y1 of the existing tentative software to produce a basic process execution log (software model). Consequently, working effects similar to those of the embodiments described above can be obtained.

Further, the function module production section 6 and the basic process execution log production section 10 are separately provided in the embodiments described above. However, the present invention is not limited to this, and the function module production section 6 may be implemented as part of the function of the basic process execution log production section 10.

It is to be noted that the functions as the SW/HW division section 2, flag processing section 3, first acquisition section 4, division section 5, function module production section 6, basic process execution log production section 10, easy software model production section 11, second acquisition section 12, synthesis section 13 and simulation execution section 20 may be implemented by a computer (including a CPU, an information processing apparatus and various kinds of terminals) by executing a predetermined application program (simulation program).

The program is provided in a state wherein it is recorded on a computer-readable recording medium such as, for example, a flexible disk, a CD (CD-ROM, CD-R, CD-RW or the like), a DVD (DVD-ROM, DVD-RAM, DVD-R, DVD-RW, DVD+R, DVD+RW or the like). In this instance, a computer reads out the simulation program from the recording medium and transfers the read out program to an internal storage apparatus or an external storage apparatus so that the program is stored and used. Further, the program may be recorded in advance on a storage apparatus (recording medium) such as, for example, a magnetic disk, an optical disk, a magneto-optical disk or the like such that the program is provided from the storage apparatus to the computer through a communication line.

Here, the computer is a concept including hardware and an OS (operating system) and signifies the hardware which operates under the control of the OS. Further, where no OS is required and hardware is operated only by an application program, the hardware itself corresponds to a computer. The hardware at least includes a microprocessor such as a CPU and a means for reading out the computer program recorded on the recording medium.

The application program as the simulation program described above includes program codes for causing such a computer as described above to implement the functions as the SW/HW division section 2, flag processing section 3, first acquisition section 4, division section 5, function module production section 6, basic process execution log production section 10, easy software model production section 11, second acquisition section 12, synthesis section 13 and simulation execution section 20. Further, some of the functions may be implemented not by an application program but by an OS.

What is claimed is:

1. A simulation apparatus for executing simulation for performance evaluation of a system to be implemented by software and hardware using a hardware model, the simulation apparatus comprising a processor, wherein the processor executes a process including: first acquiring a first execution log representing a history of an instruction executed when existing tentative software is executed;
    dividing the first execution log into a plurality of basic processing units;
    modifying some of the plural basic processing units to produce a basic processing execution log to be used for the simulation; and
    inputting the basic processing execution log to the hardware model to execute the simulation to acquire information required for the performance evaluation,
    wherein the modifying comprises:
    extracting a modification target basic processing unit from among the plural basic processing units and producing a software model based on the extracted modification target basic processing unit;
    second acquiring a tentative execution log based on the software model; and
    synthesizing the plural basic processing units other than the modification target basic processing unit and the tentative execution log to produce the basic processing execution log.

2. The simulation apparatus as claimed in claim 1, wherein:
    the processor further executes a process including
    embedding a flag representative of a branch line of a source code or a function row for calling an object in the tentative software into the tentative software; and
    the first acquiring comprises executing the tentative software in which the flag is embedded to acquire the first execution log, and
    the producing comprises producing an object sequence in the modification target basic processing unit based on flag information corresponding to the flag in the modification target basic processing unit and extracting the source code to produce the software model.

3. The simulation apparatus as claimed in claim 1, wherein the inputting comprises inputting the basic processing execution log to the hardware model based on event control information in the first execution log.

4. A simulation method for executing simulation for performance evaluation of a system to be implemented by software and hardware using a hardware model, comprising:
    a first acquisition step of acquiring a first execution log representing a history of an instruction executed when existing tentative software is executed;
    a division step of dividing the first execution log into a plurality of basic processing units;
    a basic processing execution log production step of modifying some of the plural basic processing units to produce a basic processing execution log to be used for the simulation; and
    a simulation execution step of inputting the basic processing execution log to the hardware model to execute the simulation to acquire information required for the performance evaluation,
    wherein the basic processing execution log production step includes:
    a software model production step of extracting a modification target basic processing unit from among the plural basic processing units and producing a software model based on the extracted modification target basic processing unit;
    a second acquisition step of acquiring a tentative execution log based on the software model; and
    a synthesis step of synthesizing the plural basic processing units other than the modification target basic processing unit and the tentative execution log to produce the basic processing execution log.

5. The simulation method as claimed in claim 4, further comprising:
    a flag processing step of embedding a flag representative of a branch line of a source code or a function row for calling an object in the tentative software into the tentative software; and wherein,
    at the first acquisition step, the tentative software in which the flag is embedded is executed to acquire the first execution log, and
    at the software model production step, an object sequence in the modification target basic processing unit is produced based on flag information corresponding to the flag in the modification target basic processing unit and the source code is extracted to produce the software model.

6. The simulation method as claimed in claim 4, wherein, at the simulation execution step, the basic processing execution log is inputted to the hardware model based on event control information in the first execution log.

7. A non-transitory computer-readable recording medium in which a simulation program is recorded for causing a computer to implement a function for executing simulation for performance evaluation of a system to be implemented by software and hardware using a hardware model, the simulation program causing the computer to function as:
- a first acquisition section adapted acquire a first execution log representing a history of an instruction executed when existing tentative software is executed;
- a division section adapted to divide the first execution log into a plurality of basic processing units;
- a basic processing execution log production section adapted to modify some of the plural basic processing units to produce a basic processing execution log to be used for the simulation; and
- a simulation execution section adapted to input the basic processing execution log to the hardware model to execute the simulation to acquire information required for the performance evaluation,
- wherein, when the computer is caused to function as the basic processing execution log production section, the simulation program causes the computer to function as:
- a software model production section adapted to extract a modification target basic processing unit from among the plural basic processing units and producing a software model based on the extracted modification target basic processing unit;
- a second acquisition section adapted to acquire a tentative execution log based on the software model; and
- a synthesis section adapted to synthesize the plural basic processing units other than the modification target basic processing unit and the tentative execution log to produce the basic processing execution log.

8. The non-transitory computer-readable recording medium on or in which a simulation program is recorded as claimed in claim 7, wherein the simulation program causes the computer to function as a flag processing section adapted to embed a flag representative of a branch line of a source code or a function row for calling an object in the tentative software into the tentative software;
- the first acquisition section executing the tentative software in which the flag is embedded to acquire the first execution log;
- the software model production section producing an object sequence in the modification target basic processing unit based on flag information corresponding to the flag in the modification target basic processing unit and extracting the source code to produce the software model.

9. The non-transitory computer-readable recording medium on which a simulation program is recorded as claimed in claim 7, wherein the simulation program causes the computer to function so that the simulation execution section inputs the basic processing execution log to the hardware model based on event control information in the first execution log.

\* \* \* \* \*